(12) United States Patent
Lee et al.

(10) Patent No.: US 8,520,182 B2
(45) Date of Patent: Aug. 27, 2013

(54) FLAT PANEL DISPLAY AND MANUFACTURING METHOD THEREOF

(75) Inventors: Hyun-Chul Lee, Yongin (KR); Won-Kyu Lim, Yongin (KR); Jae-Seok Park, Yongin (KR); Cheol-Lae Roh, Yongin (KR); Yong-Jin Lee, Yongin (KR); Jang-Hwan Shin, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 316 days.

(21) Appl. No.: 12/946,789

(22) Filed: Nov. 15, 2010

(65) Prior Publication Data

US 2011/0194063 A1 Aug. 11, 2011

(30) Foreign Application Priority Data

Feb. 8, 2010 (KR) .................. 10-2010-0011502

(51) Int. Cl.
  *G02F 1/1333* (2006.01)
(52) U.S. Cl.
  USPC .......................... 349/158; 349/160
(58) Field of Classification Search
  USPC .................................. 349/158, 160
  See application file for complete search history.

(56) References Cited

U.S. PATENT DOCUMENTS 6,191,840 B1 * 2/2001 Bon ........................ 349/187

FOREIGN PATENT DOCUMENTS

| | | |
|---|---|---|
| JP | 2612332 B2 | 2/1997 |
| JP | 2005-288503 A | 10/2005 |
| JP | 2008-238205 | 10/2008 |
| JP | 4284274 B2 | 3/2009 |
| KR | 10-2001-0054662 | 7/2001 |
| KR | 10-2001-0054662 A | 7/2001 |
| KR | 10-2005-0113407 | 5/2004 |
| KR | 10-0686806 | 2/2007 |
| KR | 10-2008-0100556 | 11/2008 |
| WO | WO 2004/009282 A1 | 1/2004 |

OTHER PUBLICATIONS

Korean Office Action dated Apr. 12, 2011 for Korean Patent Application No. KR 10-2010-0011502 which corresponds to captioned U.S. Appl. No. 12/946,789.

Korean Notice of Allowance dated Oct. 1, 2011 for Korean Patent Application No. KR 10-2010-0011502 which corresponds to captioned U.S. Appl. No. 12/946,789.

* cited by examiner

*Primary Examiner* — Phu Vu
(74) *Attorney, Agent, or Firm* — Knobbe, Martens, Olson & Bear LLP

(57) ABSTRACT

A flat panel display is disclosed. In one embodiment, the display includes i) a first substrate including a display area, wherein at least one display element is formed in the display area, ii) a second substrate covering the display area and connected to the first substrate, iii) a sealant formed between the first and second substrates. In one embodiment, the first substrate and the second substrate comprise a first cut surface and a second cut surface, respectively. Further, each of the first cut surface and the second cut surface has a plurality of corners each of which is concave from the perspective of the display area.

12 Claims, 15 Drawing Sheets

FLAT PANEL DISPLAY AND MANUFACTURING METHOD THEREOF

RELATED APPLICATIONS

This application claims priority to and the benefit of Korean Patent Application No. 10-2010-0011502 filed in the Korean Intellectual Property Office on Feb. 8, 2010, the entire content of which is incorporated herein by reference.

BACKGROUND

1. Field

The described technology generally relates to a display device. More particularly, the described technology relates to a flat panel display having a curved cut-surface and a method of manufacturing the flat panel display.

2. Description of the Related Technology

Flat panel displays generally use thin film transistors. Examples of such displays include organic light emitting diode (OLED) displays and liquid crystal displays. Recently, such displays have been widely used in applications ranging from small mobile electronic devices to large displays such as TVs. The displays generally include a lamination structure of first and second substrates, at least one of which has a display structure formed on its inner surface.

OLED displays include organic light emitting diodes each having a thin film transistor and an organic emission layer which are formed on the inner surface of the first substrate. Liquid crystal displays include pixel electrodes and thin film transistors which are formed on the inner surface of the first substrate, and a common electrode and a color filter layer which are formed on the inner surface of the second substrate, with a liquid crystal layer interposed between the first and second substrates.

SUMMARY

One inventive aspect is a display device that is manufactured using mother substrates and a cell cutting process, and a manufacturing method thereof, which can increase strength through an improvement of the shape of a cut surface and omit an edge grinding process after cell cutting.

Another aspect is a display device including: a first substrate including a display area having display elements formed therein; a second substrate covering the display area and fixed onto the first substrate; and a sealant disposed between the first and second substrates. The first substrate and the second substrate include a first cut surface and a second cut surface, respectively, formed by cell cutting. The first cut surface and the second cut surface include a plurality of corners that are formed in a curve that is concave toward the display area when viewed from the plane of the display device.

The plurality of corners may be formed in circular arcs. The plurality of corners may have a curvature radius of 100 μm to 2000 μm. The first cut surface and the second cut surface may further include a plurality of linear portions that are positioned between the plurality of corners when viewed from the plane of the display device.

The first cut surface and the second cut surface may be inclined with respect to one surface of each of the first and second substrates at the plurality of linear portions and the plurality of corners when viewed from a side of the display device. The first cut surface and the second cut surface may be formed in a round shape when viewed from the side of the display device.

The first cut surface and the second cut surface may each have an inward end and an outward end, wherein the inward ends of the first and second cut surfaces may be in contact with the inner surfaces of the first and second substrates, respectively, and the outward ends of the first and second cut surfaces may be in contact with the outer surfaces of the first and second substrates, respectively.

The first substrate and the second substrate may have the same thickness, and the first cut surface and the second cut surface may have the same width. The first cut surface and the second cut surface may be symmetrical with respect to the sealant along an overlap area of the first substrate and the second substrate.

The first cut surface and the second cut surface may be formed by a swung shot-pulse laser beam, and a plurality of grains resulting from the swinging of the short-pulse laser beam may be formed on the first cut surface and the second cut surface.

The display device may be an organic light emitting diode display or liquid crystal display.

Another aspect is a manufacturing method of a display device, the method including: i) preparing two mother substrates; ii) forming a plurality of cells for display on at least one of the mother substrates and forming a plurality of sealant lines enclosing the respective cells on either one of the mother substrates; iii) assembling and sealing the two mother substrates with the plurality of sealant lines interposed therebetween; and iv) mounting the two mother substrates on a stage, irradiating a short-pulse laser beam swung by a light swing unit to a light irradiation region defined on the mother substrates, transferring either or both of the light swing unit and the stage to move the light irradiation region along an imaginary cut line where the mother substrates are to be cut, and cutting the mother substrates. The light irradiation region includes a linear region and a curved region.

In the cutting of the mother substrates, the overlying one of the two mother substrates may be cut, the two mother substrates may be mounted upside down on the stage, and the other mother substrate, which is now the overlying substrate, may be cut.

In the cutting of the mother substrates, the mother substrates may be cut such that the display device has a plurality of linear portions and a plurality of corners, and the plurality of corners may be cut in a curve that is concave toward the center of the mother substrates.

In the cutting of the mother substrates, the short-pulse laser beam swung by the light swing unit may physically remove the mother substrates within the light irradiation region. The cutting of the mother substrates may further include cleaning the area from which the mother substrates are removed by the short-pulse laser beam.

The short-pulse laser beam may have a unit irradiation time shorter than 50 ps (picoseconds) and a pulse frequency within the range of 0.1 MHz to 100 MHz.

The cutting of the mother substrates may further include preheating the mother substrates by a preheating laser beam before the swung short-pulse laser beam removes a part of the mother substrates. The preheating laser beam may be a carbonic acid ($CO_2$) gas laser beam.

In the cutting of the mother substrates, the light swing unit may vary the incident angle of the short-pulse laser beam with respect to the mother substrates by swinging the short-pulse laser beam.

The light swing unit may include a reflector for reflecting a short-pulse laser beam emitted from a short-pulse laser generator and a driver having a plurality of rotation shafts for driving the reflector by finely swinging the reflector. The plurality of rotation shafts may include a first rotation shaft and a second rotation shaft crossing the first rotation shaft. Another aspect is a flat panel display comprising: a first substrate including a display area, wherein at least one display element is formed in the display area; a second substrate covering the display area and connected to the first substrate; and a sealant formed between the first and second substrates, wherein the first substrate and the second substrate comprise a first cut surface and a second cut surface, respectively, and wherein each of the first cut surface and the second cut surface has a plurality of corners each of which is concave from the perspective of the display area.

In the above display, the corners have an arc shape. In the above display, each of the corners has a curvature radius of about 100 μm to about 2000 μm. In the above display, each of the first cut surface and the second cut surface further comprises a plurality of linear portions that are positioned between the corners. In the above display, each of the first cut surface and the second cut surface is inclined, with respect to one surface of each of the first and second substrates at the linear portions and the corners, when viewed from a side of the display device. In the above display, each of the first cut surface and the second cut surface has a round shape when viewed from the side of the display device.

In the above display, the first cut surface and the second cut surface each have an inward end and an outward end, wherein the inward ends of the first and second cut surfaces are connected to the inner surfaces of the first and second substrates, respectively, and wherein the outward ends of the first and second cut surfaces are connected to the outer surfaces of the first and second substrates, respectively. In the above display, the first substrate and the second substrate have substantially the same thickness, and wherein the first cut surface and the second cut surface have substantially the same width.

In the above display, the first cut surface and the second cut surface are substantially symmetrical with respect to the sealant along an overlap area of the first substrate and the second substrate. In the above display, each of the convex corners has a center portion and edge portions, and wherein the center portion is farther from the sealant than the edge portions. In the above display, the display is an organic light emitting diode display or a liquid crystal display.

Another aspect is a method of manufacturing a flat panel display, comprising: pre paring first and second mother substrates; forming a plurality of display cells on at least one of the mother substrates; forming a plurality of sealant lines enclosing the respective cells on either one of the mother substrates; assembling and sealing the two mother substrates with the sealant lines interposed therebetween; mounting the two mother substrates on a stage; irradiating a laser beam to a defined light irradiation region of the mother substrates; and cutting the mother substrates while moving the light irradiation region along an imaginary cut line where the mother substrates are to be cut, wherein the light irradiation region comprises a linear region and a curved region.

In the above method, the cutting comprises: cutting the first mother substrate which is positioned on the top of the second mother substrate; turning over the two mother substrates so that the second mother substrate is positioned on the top of the first mother substrate; and cutting the second mother substrate.

In the above method, the cutting comprises: cutting the mother substrates such that the display device has a plurality of linear portions and a plurality of corners, and that the corners are convex when viewed from an external side of the mother substrates.

In the above method, the cutting comprises physically removing at least a portion of the mother substrates within the light irradiation region. The above method further comprises cleaning the area from which the portion of the mother substrates is removed by the laser beam. In the above method, the laser beam has a unit irradiation time shorter than about 50 ps (picoseconds) and a pulse frequency in the range of about 0.1 MHz to about 100 MHz.

The above method further comprises preheating the mother substrates before removing the portion of the mother substrates. In the above method, the preheating is performed with the use of a carbonic acid ($CO_2$) gas laser beam. The above method further comprises varying, with the use of a light swing unit, the incident angle of the laser beam with respect to the mother substrates by swinging the laser beam.

In the above method, the light swing unit comprises a reflector configured to reflect an incident laser beam and a driver having a plurality of rotation shafts configured to drive the reflector by finely swinging the reflector. In the above method, the rotation shafts comprise a first rotation shaft and a second rotation shaft crossing the first rotation shaft.

Another aspect is a flat panel display comprising: a first substrate including a display area, wherein at least one display element is formed in the display area; a second substrate covering the display area and connected to the first substrate; and at least one thin film transistor formed between the first and second substrates, wherein each of the first and second substrates has a cut surface, wherein the cut surface has a plurality of corners each of which is convex when viewed from the exterior of the display device.

DETAILED DESCRIPTION

For mass production, flat panel displays are manufactured typically from two large-sized mother substrates. Such a manufacturing method may include i) forming a plurality of cells (one cell corresponds to one display device) on at least one of the mother substrates, ii) forming a plurality of sealant lines enclosing the respective cells on any one of the mother substrates and iii) then assembling the two mother substrates. The method may further include bonding the two mother substrates by melting the sealant lines and then hardening it, and cutting the regions between the cells.

When cutting out the regions between the cells, a wheel cutter is placed on the mother substrates, and the wheel cutter is moved along a predetermined cutting path on the mother substrates while applying pressure to the wheel, such that a groove of a predetermined depth is formed on the mother substrates. This groove is formed on both of the mother substrates. Then, an impact is applied to the mother substrates to propagate cracks across the mother substrates along the grooves. Thus, individual display devices are separated from the mother substrates.

Since, in such a cell cutting process, the cells are split by applying force after the formation of a groove, curve cutting cannot be achieved because of the characteristics of the process, and therefore only linear cutting can be carried out. Accordingly, the display device has a rectangular shape, and its corners form right angles. Moreover, a cut surface of the display device is maintained at almost a right angle with respect to one surface (inner or outer surface) of each of the first and second substrates.

After the cell cutting is performed, an edge grinding process is performed to grind the cut surface using a grinder and rounding the corners having right angles because the aforementioned linear cutting and right-angle cutting lower the overall strength of the display device. This additional process decreases the productivity of the product. Further, the liquid crystal display has a problem of causing a defect in the display device because glass powder generated in the edge grinding process may be introduced into a liquid crystal fill port.

Embodiments will be described more fully hereinafter with reference to the accompanying drawings. As those skilled in the art would realize, the described embodiments may be modified in various different ways.

Figure 1:
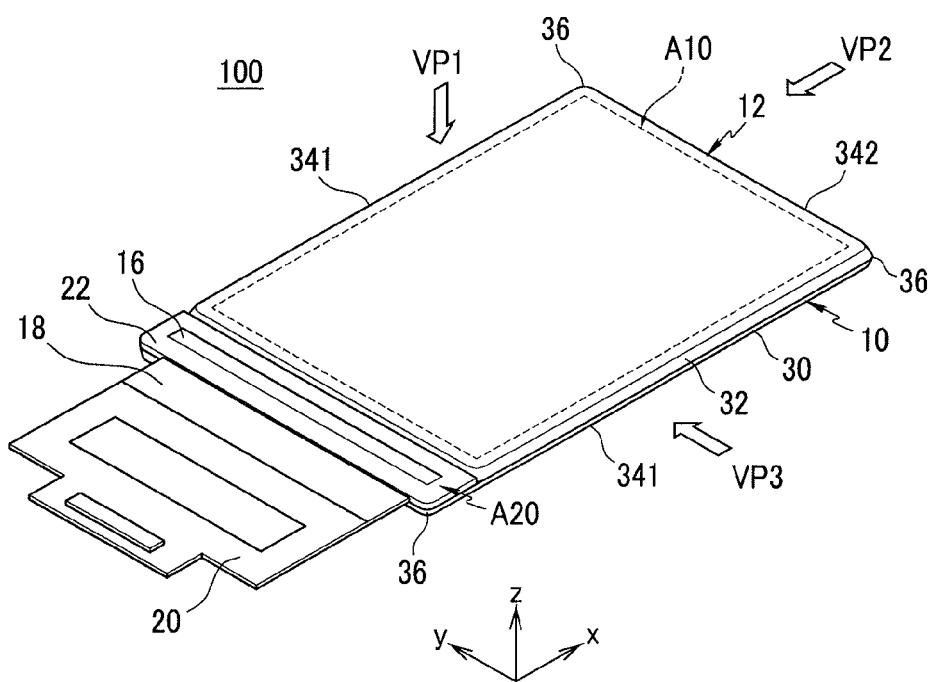
FIG. 1 is a perspective view showing a schematic configuration of a display device according to one exemplary embodiment.
Figure 2:
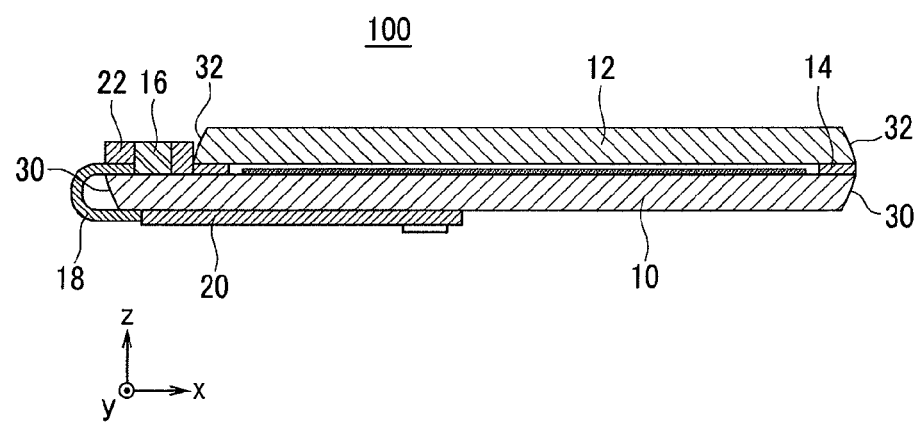
FIG. 2 is a cross-sectional view of the display device shown in FIG. 1.

FIG. 1 is a perspective view showing a schematic configuration of a display device according to one exemplary embodiment, and FIG. 2 is a cross-sectional view of the display device shown in FIG. 1.

Referring to FIGS. 1 and 2, a display device 100 includes i) a first substrate 10 having a display area A10 and a pad area A20, ii) a second substrate 12 covering the display area A10 and fixed onto the first substrate 10, and iii) a sealant 14 for bonding the first substrate 10 and the second substrate 12 together. In one embodiment, the display device 100 is an organic light emitting diode display or liquid crystal display, and a detailed internal structure thereof will be described later.

In one embodiment, the second substrate 12 has a smaller size than that of the first substrate 10, and edges of the second substrate 12 are fixed to the first substrate 10 by means of the sealant 14. The display area A10 is positioned inside an overlap area of the first and second substrates 10 and 12 at an inner side of the sealant 14, on which an image is actually displayed, and the pad area A20 is positioned on the first substrate 10 at the outer side of the sealant 14.

In one embodiment, a plurality of display elements (or sub-pixels) are arranged in a matrix form at the display area A10, and a scan driver (not shown) and a data driver (not shown) for driving the display elements are positioned between the display area A10 and the sealant 14 or at the outer side of the sealant 14.

Pad electrodes for transferring electrical signals to the scan driver and the data driver are positioned at the pad area A20, and an integrated circuit chip 16 is mounted thereon. In one embodiment, on the pad area A20, a flexible circuit board 18 is mounted in a chip-on-film manner after a cell cutting process to be explained later to electrically connect a printed circuit board 20 and the pad electrodes. In FIGS. 1 and 2, reference numeral 22 represents a protective layer.

For mass production, the above-stated display device 100 is generally manufactured through a process of simultaneously making a plurality of display devices using two mother substrates and then separating them into individual display devices by a cell cutting process. That is, the individual display devices are separated from the mother substrates by performing a cell cutting process for the first substrate 10 and a cell cutting process for the second substrate 12 when the first substrate 10 and the second substrate 12 are bonded together by the sealant 14. Side surfaces of the first substrate 10 and the second substrate 12 in each display device 100 are cut by the cell cutting process.

In one embodiment, the cut surfaces 30 and 32 of the first substrate 10 and the second substrate 12 in the display device 100 include four linear portions 341 and 342 and four corners 36 when viewed from the plane of the display device 100. In one embodiment, the four corners 36 are formed in a curve that is concave from the perspective of the display area A10. The four corners 36 are convex when viewed from the exterior of the display device 100. Further, the four corners 36 have curved edges. When viewed from a side of the display device 100, the cut surfaces 30 and 32 are inclined with respect to one surface (inner or outer surface) of each of the first and second substrates 10 and 12 at all of the four linear portions 341 and 342 and the four corners 36.

The shape of the cut surfaces 30 and 32 when viewed from the "plane" of the display device 100 indicates the shape of the cut surfaces 30 and 32 seen when an observer observes the plane of the display device 100. The shape of the cut surfaces 30 and 32 when viewed from the side of the display device indicates the shape of the cut surfaces 30 and 32 seen when the observer observes the side of the display device 100.

Figure 3:
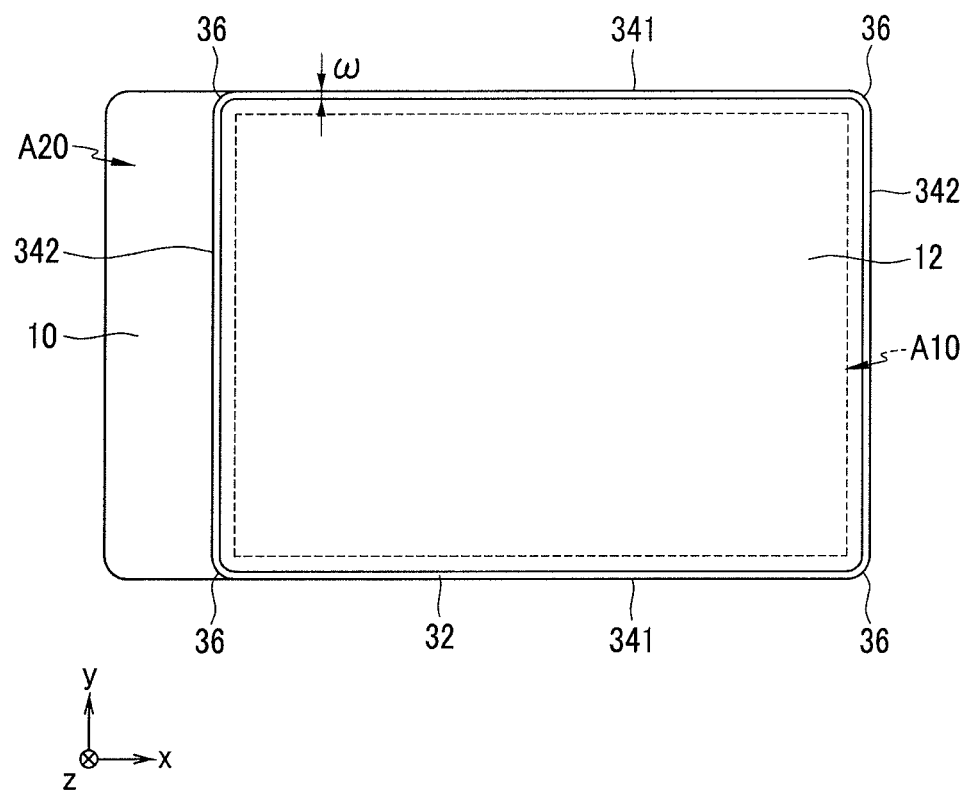
FIG. 3 is a top plan view of first and second substrates of the display device shown in FIG. 1 when observed from view point VP1.

In FIG. 1, the observer's point of view of the plane of the display device 100 with respect to the display device 100 laid on the ground is indicated by the VP1 arrow. FIG. 3 is a top plan view of first and second substrates of the display device shown in FIG. 1 when observed from view point VP1, and FIG. 4 is a top plan view of the first substrate when observed from view point VP1 with the display device shown in FIG. 1 turned upside down so that the first substrate rests on the second substrate.

Figure 4:
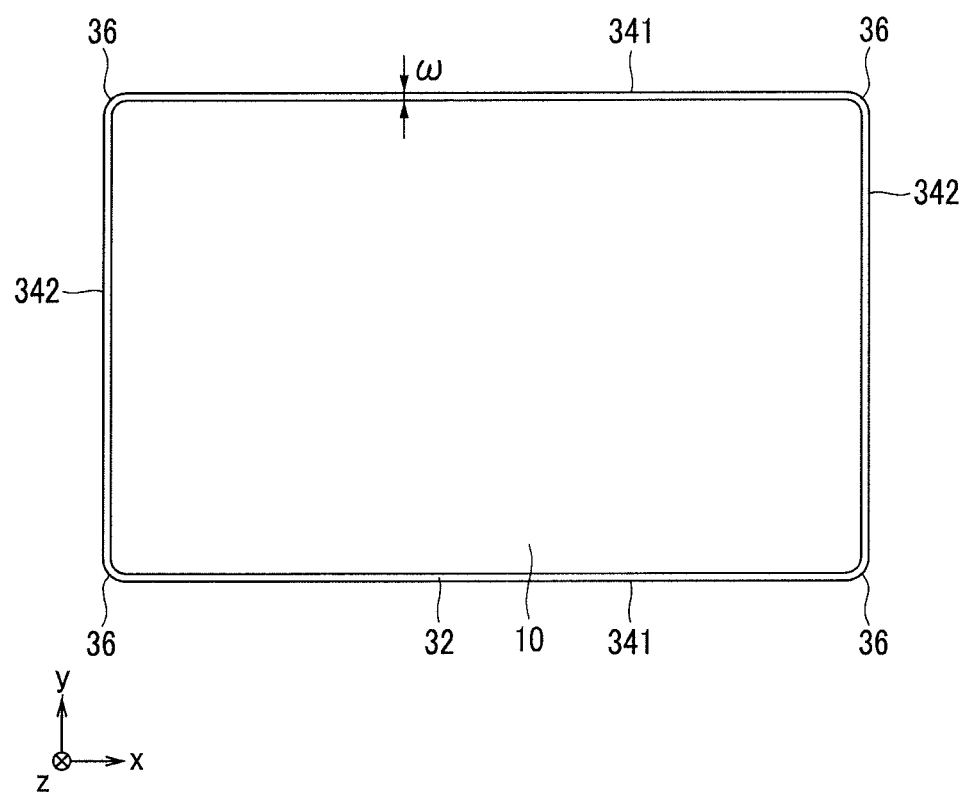
FIG. 4 is a top plan view of the first substrate when observed from view point VP1 with the display device shown in FIG. 1 turned upside down so that the first substrate rests on the second substrate.

In one embodiment, as shown in FIGS. 3 and 4, the cut surface 30 (hereinafter referred to as "first cut surface") of the first substrate 10 and the cut surface 32 (hereinafter referred to as "second cut surface") of the second substrate 12 have two long linear portions 341, two short linear portions 342, and four corners 36 when viewed from the plane of the display device 100. In one embodiment, the four corners 36 have a predetermined curvature, rather than a right angle. That is, the four corners 36 are formed in a curve (e.g., circular or semicircular arc) that is concave toward the display area A10.

The curved corners 36 do not result from grinding, but are made from the cut surfaces themselves that are formed by cutting the first and second substrates 10 and 12 in the cell cutting process. This is made possible by applying a short-pulse laser processing technique to be described later, instead of the conventional wheel cutter, in the cell cutting process. By applying the short-pulse laser processing technique, it is easy to cut various shapes of curves as well as straight lines.

The curved corners 36 function to increase the overall strength of the display device 100. That is, if a user drops the display device 100 or an external impact is applied to the display device 100, it is assumed that the external impact is applied first and most strongly near the corners of the first and second substrates 10 and 12 of the display device 100.

If the corners of the first and second substrates 10 and 12 form right angles, a stress is concentrated near the corners 36 due to an external impact and cracks are generated at the corners. These cracks may propagate into the display device 100 and cause severe damage to the display device 100. However, as in this exemplary embodiment, the display device 100 having the curved corners 36 can increase mechanical strength by effectively dispersing the stress at the portions of the corners 36, thereby preventing damage caused by external impact.

Figure 5:
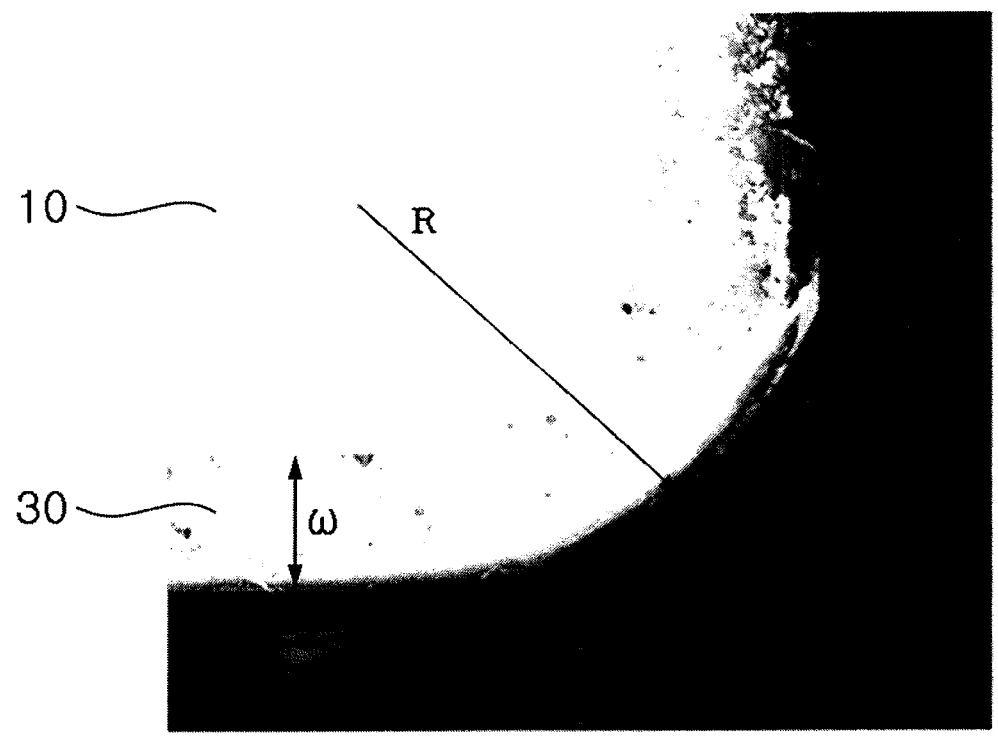
FIG. 5 is a magnified photograph showing portions around the corners of the first substrate of the display device manufactured according to an embodiment.

FIG. 5 is a magnified photograph showing portions around the corners of the first substrate of the display device manufactured according to one embodiment. Although FIG. 5 shows only one corner of the first cut surface 30, the other corners of the first cut surface 30 and the corners of the second surface 32 are also formed in substantially the same shape as that shown in FIG. 5.

Referring to FIG. 5, a curvature radius R of the corners of the first cut surface 30 may be approximately 100 µm to approximately 2000 µm. In one embodiment, the above range provides improved strength of the display device 100 while the corners 36 do not have an excessively round shape. However, the curvature radius R of the corners may be less than about 100 µm or greater than about 2000 µm depending on the embodiment. The curvature radius R of the first cut surface 30 indicates a curvature radius measured with respect to an outer end of the first cut surface 30.

Figure 6:
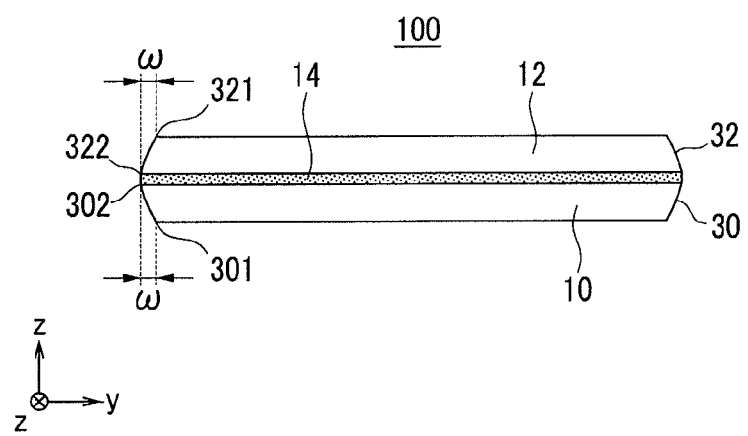
FIG. 6 is a side view of the display device shown in FIG. 1 when observed from viewpoint VP2.
Figure 7:
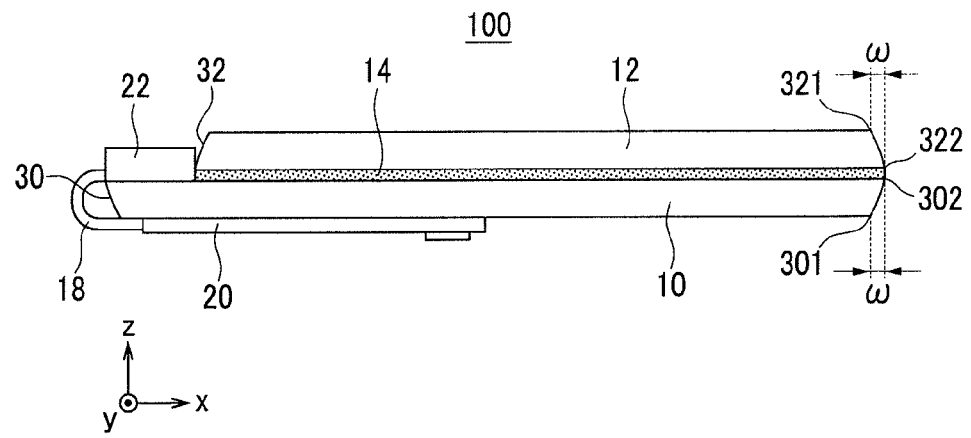
FIG. 7 is a side view of the display device shown in FIG. 1 when observed from viewpoint VP3.

In one embodiment, the first cut surface 30 and the second cut surface 32 are inclined with respect to one surface (inner or outer surfaces) of each of the first and second substrates 10 and 20 with respect to a side of the display device 100. In FIG. 1, the observer's points of view of one long linear portion and one short linear portion of the sides of the display device are indicated by the VP2 arrow and the VP3 arrow. FIGS. 6 and 7 are side views of the display device shown in FIG. 1 when observed from the viewpoints VP2 and VP3, respectively.

Referring to FIGS. 6 and 7, the first cut surface 30 and the second cut surface 32 are inclined at a predetermined angle, rather than a right angle, with respect to the surfaces (inner or outer surfaces) of each of the first and second substrates 10 and 12 at all of the four linear portions 341 and 342 and the four corners 36. The first cut surface 30 and the second cut surface 32 may be formed in a round shape having a predetermined curvature.

Therefore, the first cut surface 30 and the second cut surface 32 include inward ends 301 and 321 facing inwardly with respect to the display device 100 and outward ends 302 and 322 facing outwardly with respect to the display device 100, and have a given width w along the four linear portions 341 and 342 and the four corners 36. In FIG. 6, the width of the first cut surface 30 is indicated by W.

On the first substrate 10 and the second substrate 12 bonded together by the sealant 14, the inward end 301 of the first cut surface 30 is in contact with or connected to the outer surface of the first substrate 10, and the outward end 302 of the first cut surface 30 is in contact with or connected to the inner surface of the first substrate 10. The inward end 321 of the second cut surface 32 is in contact with or connected to the outer surface of the second substrate 12, and the outward end 322 of the second cut surface 32 is in contact with or connected to the inner surface of the second substrate 12. Accordingly, the second cut surface 32 having a predetermined width w can be observed in FIG. 6, and the first cut surface 30 having a predetermined width w can be observed in FIG. 7.

If the first substrate 10 and the second substrate 12 have substantially the same thickness, the width w of the first cut surface 30 and the width w of the second cut surface 32 may be substantially equal. Moreover, the first cut surface 30 and the second cut surface 32 are substantially symmetrical with respect to the sealant 14 along the edges of an overlap area of the first substrate and the second substrate.

The first and second inclined cut surfaces 30 and 32 may be obtained by using the short-pulse laser processing method to be described later. In one embodiment, the mechanical strength of the display device can be increased by effectively dispersing stress as compared to the cut surfaces formed at a right angle with respect to the surfaces (inner or outer surfaces) of each of the first and second substrates. Moreover, as the first and second cut surfaces 30 and 32 are substantially symmetrical to each other with the sealant 14 interposed therebetween, the stress applied to the edges of the display 100 is more effectively dispersed, thus suppressing damage to the display device 100.

In one embodiment, the above-described display device 100 is an organic light emitting diode display or liquid crystal display. Further, the disclosed technology may be embodied in other types of flat panel displays.

Figure 8:
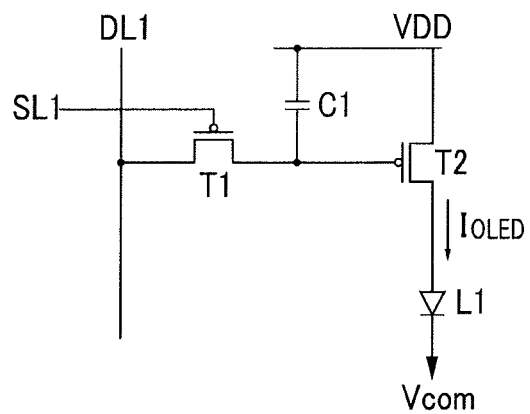
FIG. 8 is a view showing a sub-pixel circuit structure of an organic light emitting diode display.
Figure 9:
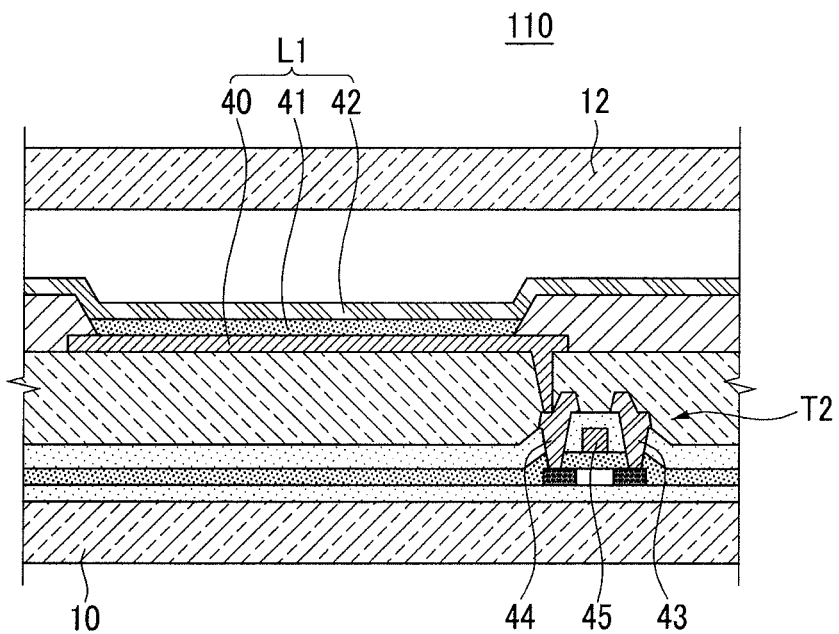
FIG. 9 is a partially enlarged cross-sectional view of the organic light emitting diode display.

FIG. 8 is a view showing a sub-pixel circuit structure of an organic light emitting diode display, and FIG. 9 is a partially enlarged cross-sectional view of the organic light emitting diode display.

Referring to FIGS. 8 and 9, one sub-pixel includes an organic light emitting element L1 and a driving circuit unit. The organic light emitting element L1 includes an anode (hole injection electrode) 40, an organic emission layer 41, and a cathode (electron injection anode) 42. The driving circuit unit includes at least two thin film transistors T1 and T2 and at least one storage capacitor C1. The thin film transistors basically include a switching transistor T1 and a driving transistor T2.

The switching transistor T1 is connected to a scan line SL1 and a data line DL1, and transmits a data voltage input to the data line DL1 to the driving transistor T2 according to a switching voltage input to the scan line SL1. The storage capacitor C1 is connected to the switching transistor T1 and a power supply line VDD, and stores a voltage corresponding to a difference between the voltage transmitted from the switching transistor T1 and a voltage supplied to the power supply line VDD.

The driving transistor T2 is connected to the power supply line VDD and the storage capacitor C1, and supplies an output current $I_{OLED}$ in proportion to the square of the difference between the voltage stored in the storage capacitor C1 and a threshold voltage to the organic light emitting element L1, and the organic light emitting element L1 emits light according to the output current $I_{OLED}$. The driving transistor T2 includes a source electrode 43, a drain electrode 44, and a gate electrode 45, and the anode 40 of the organic light emitting element L1 can be connected to the drain electrode 44 of the driving transistor T2.

In the organic light emitting diode display 110, the sub-pixel is not limited to the aforementioned configuration and can be varied.

Figure 10:
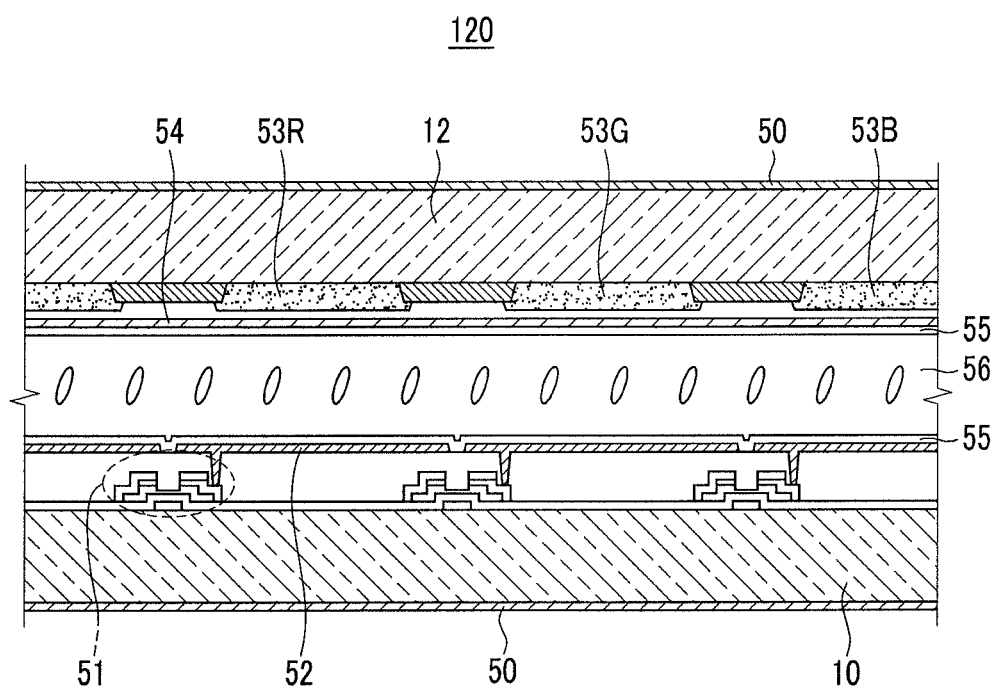
FIG. 10 is a partially enlarged cross-sectional view of a liquid crystal display.

FIG. 10 is a partially enlarged cross-sectional view of a liquid crystal display.

Referring to FIG. 10, the liquid crystal display 120 includes a pair of polarizing plates 50 attached to outer surfaces of the first and second substrates 10 and 12, a plurality of thin film transistors 51 formed on an inner surface of the first substrate 10, and pixel electrodes 52 connected to the respective thin film transistors 51. Further, the liquid crystal display 120 includes a color filter layer 53R, 53G, and 53B formed on an inner surface of the second substrate 12, a common electrode 54 covering the color filter layer 53R, 53G, and 53B, a pair of alignment films 55 covering the pixel electrodes 52 and the common electrode 54, respectively, and a liquid crystal layer 56 injected between the first substrate 10 and the second substrate 12.

One thin film transistor 51 and one pixel electrode 52 are disposed at each sub-pixel. The color filter layer 53R, 53G, and 53B includes a red filter layer 53R, a green filter layer 54, and a blue filter layer 53B respectively corresponding to the pixel electrodes 52. A backlight unit (not shown) or a reflecting plate (not shown) is positioned on the back surface of the first substrate 10 to provide light emitted from the backlight unit or external light reflected by the reflecting plate to the first substrate 10.

When the thin film transistor 51 at a specific sub-pixel is turned on, an electric field is formed between the pixel electrode 52 and the common electrode 54, an arrangement angle of liquid crystal molecules changes by the electric field, and light transmittance varies according to the changed arrangement angle. As such, luminance and light emission color of each pixel in the liquid crystal display 120 can be controlled through the above referenced process to display an image.

Next, a manufacturing method of the above-described display device will be described.

Figure 11:
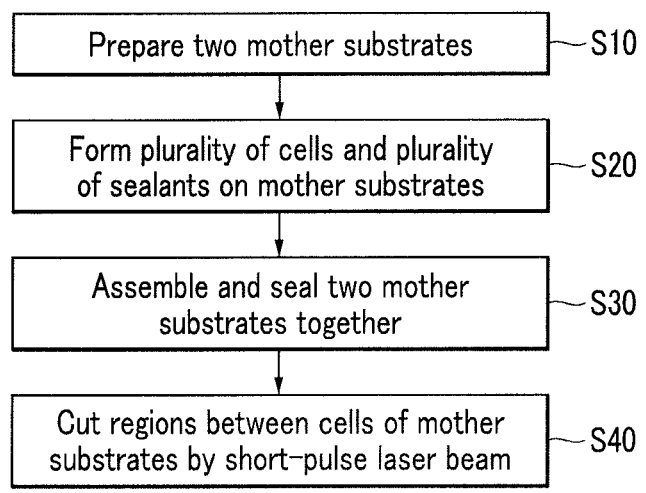
FIG. 11 is a process flowchart showing a manufacturing method of a display device according to one exemplary embodiment.

FIG. 11 is a process flowchart showing a manufacturing method of a display device according to one exemplary embodiment.

Referring to FIG. 11, the manufacturing method of the display device according to this exemplary embodiment includes a first step S10 of preparing two mother substrates and a second step S20 of forming a plurality of cells (one cell corresponds to one display device) for display on at least one of the mother substrates and forming a plurality of sealant lines enclosing the respective cells on any one of the mother substrates. In one embodiment, the manufacturing method includes a third step S30 of assembling and sealing the two mother substrates and a fourth step S40 of cutting the regions between the cells of the mother substrates by a short-pulse laser beam and separating them into individual display devices. In another embodiment, an ordinary laser beam may be used instead of a short-pulse laser beam.

Figure 12:
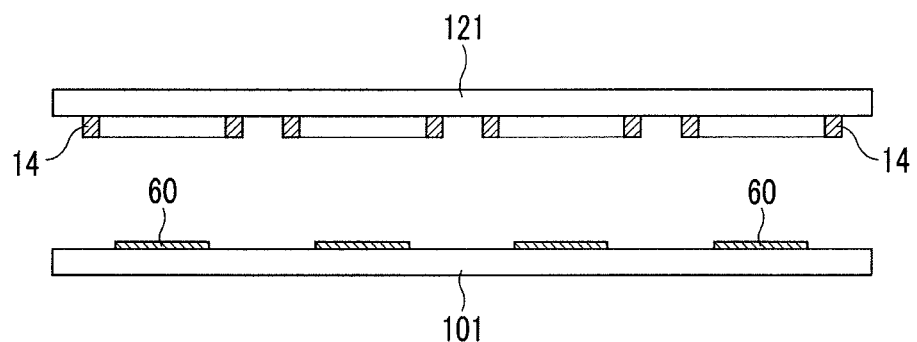
FIG. 12 is a schematic view showing first and second steps of the manufacturing method of the display device shown in FIG. 11.

FIG. 12 is a schematic view showing first and second steps of the manufacturing method of the display device shown in FIG. 11.

Referring to FIG. 12, two mother substrates 101 and 121 may be glass substrates having substantially the same thickness. Alternatively, the two mother substrates 101 and 121 may be glass substrates having different thicknesses.

In the case of an organic light emitting diode display, a plurality of cells 60 are formed on one of the mother substrates 101, and a plurality of sealant lines 14 for enclosing the respective cells 60 are formed on the other mother substrate 121 by deposition or screen printing. In the case of a liquid crystal display, a plurality of cells 60 are formed on both of the two mother substrates 101 and 121, and a plurality of sealant lines 14 enclosing the respective cells 60 are formed on any one of the mother substrates (121 in this case). In one embodiment, the sealant lines 14 are made of glass frit. In FIG. 12, the organic light emitting diode display is illustrated as an example.

Figure 13:
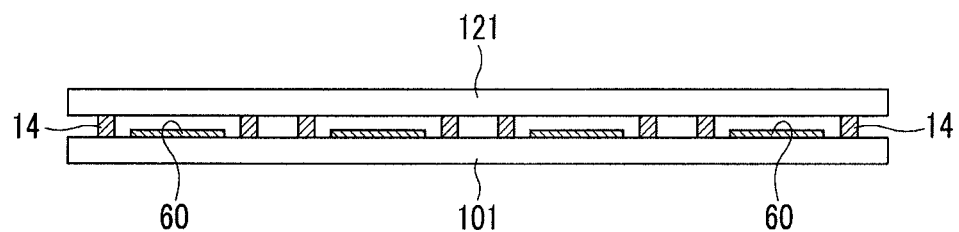
FIG. 13 is a schematic view showing a third step of the manufacturing method of the display device shown in FIG. 11.

FIG. 13 is a schematic view showing a third step of the manufacturing method of the display device shown in FIG. 11.

Referring to FIG. 13, the two mother substrates 101 and 121 are assembled with the sealant lines 14 interposed therebetween. Each of the sealant lines 14 encloses the corresponding cell 60, and the sealant lines 14 of two neighboring cells 60 are spaced apart from each other by a predetermined distance. In one embodiment, the sealant lines 14 are in a solid state, and the two mother substrates 101 and 121 are only laminated to each other. Next, a laser spot is irradiated to the sealant lines 14 from the outside of either one of the mother substrates 101 and 121. The sealant lines 14 are melted by the laser heat and then solidified to thus bond and seal the two mother substrates 101 and 121 together.

Figure 14:
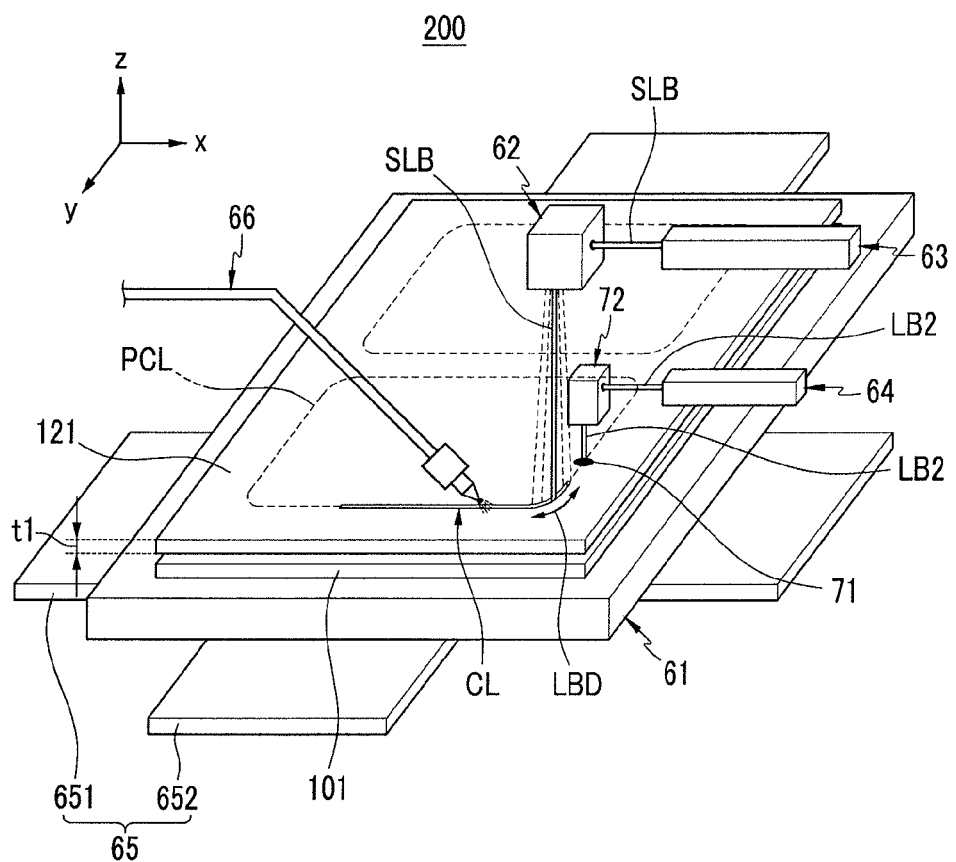
FIG. 14 is a schematic view showing a fourth step of the manufacturing method of the display device shown in FIG. 11.

FIG. 14 is a schematic view showing a fourth step of the manufacturing method of the display device shown in FIG. 11.

Referring to FIG. 14, the two bonded and sealed mother substrates 101 and 121 are mounted on a stage 61, and a short-pulse laser beam SLB swung by a light swing unit 62 is irradiated to a light irradiation region LBD defined on the mother substrate 121. Either or both of the light swing unit 62 and the stage 61 are driven to move the light irradiation region LBD along an imaginary cut line PCL, along which the mother substrate 121 is to be cut, and to cut the regions between the cells of the mother substrate 121. In one embodiment, the light irradiation region LBD includes at least one of a linear region and a curved region.

After the regions between the cells are cut from either one of the mother substrates (121 in this case) by the short-pulse laser beam SLB, the two mother substrates 101 and 121 are turned over so that the other non-cut mother substrate 101 faces upward, and the above-mentioned process is repeated to cut the regions between the cells from the other mother substrate 101. As such, individual display devices 100 can be separated from the mother substrates 101 and 121.

A substrate cutting device 200 used in the fourth step S40 includes a stage 61, a short-pulse laser generator 63, a light swing unit 62, a preheating laser generator 64, a transfer unit 65, and a cleaning unit 66.

The stage 61 supports the two mother substrates 101 and 121 to be cut. The mother substrates 101 and 121 are cut along the imaginary cut line PCL (indicated by dotted line) by means of the substrate cutting device 200. In one embodiment, the imaginary cut line PCL includes at least one of a straight line, a curved line, a circle, and an ellipse.

The short-pulse laser generator 63 emits a short-pulse laser beam SLB to be directed to the mother substrate 121. The short-pulse laser beam SLB hits the mother substrate 121 to physically remove a part of the mother substrate 121. That is, the short-pulse laser beam SLB is irradiated to the mother substrate 121 along the imaginary cut line PCL, and the mother substrate 121 is cut along the imaginary cut line PCL.

The short-pulse laser beam SLB may have a unit irradiation time shorter than about 50 ps (picoseconds) and a pulse frequency within the range of about 0.1 MHz to about 100 MHz. If the short-pulse laser beam hitting the mother substrate has a unit irradiation time longer than about 50 ps and a pulse frequency in the range of about 0.1 MHz to about 100 MHz, excessive thermal damage may be applied to the mother substrate by the laser beam. In this case, defects such as cracks formed on a cut surface of the mother substrate or damage to the vicinity of the cut surface may occur.

Moreover, the short-pulse laser beam SLB may have a wavelength in the range of about 200 nm to about 900 nm. When the laser beam has a wavelength in the aforementioned range, the laser beam is relatively well absorbed into the mother substrate 121 made of, for example, glass.

The light swing unit 62 is disposed on a light path of the short-pulse laser beam SLB emitted from the short-pulse laser generator 63 and directed to the mother substrate 121, and the short-pulse laser beam SLB is swung within the light irradiation region LBD defined on the mother substrate 121. That is, the light swing unit 62 varies the incident angle of the short-pulse laser beam SLB within a predetermined range by swinging the short-pulse laser beam SLB. Moreover, the short-pulse laser beam SLB is swung along a lengthwise direction of the light irradiation region LBD. The swung short-pulse laser beam SLB reciprocates between both ends of the light irradiation region LBD.

With an unswung short-pulse laser beam, it is difficult to stably cut a mother substrate typically having a thickness of about several hundred micrometers. If a short-pulse laser beam with a high energy level is continuously irradiated to one spot area in order to remove and cut the mother substrate having a thickness of about several hundred micrometers, cracks may be easily generated locally due to thermal shock. The cracks thus generated cannot be controlled, and random cracks may be generated in a direction crossing the cut line along which the mother substrate is cut. However, if the energy level of the laser beam is lowered enough so as to not generate cracks, there is a difficulty in cutting through the mother substrate having a thickness of about several hundred micrometers.

On the other hand, in this exemplary embodiment, a short-pulse laser beam SLB is swung within the light irradiation region LBD, so an intermittently swung short-pulse laser beam SLB is irradiated to one spot area. Thus, unnecessary cracks can be prevented from being generated in some spot areas due to thermal shock, and the energy level of a laser beam to be irradiated to the mother substrate 121 can be increased, thereby allowing the swung short-pulse laser beam SLB to stably cut the mother substrate 121 with a greater thickness.

In one embodiment, the light irradiation region LBD in which the swung short-pulse laser beam SLB is irradiated includes at least one of a linear region and a curved region. The light irradiation region LBD is changed in shape as it moves along the imaginary cut line PCL along which the mother substrate 121 is to be cut. Thus, curved corners having a predetermined curvature can be easily formed. The light irradiation region LBD in which the swung short-pulse laser beam SLB is irradiated may have a length of approximately 100 mm or less, and the short-pulse laser beam SLB may be swung within the light irradiation region LBD at a speed of approximately 0.1 m/s to approximately 10 m/s.

Figure 15:
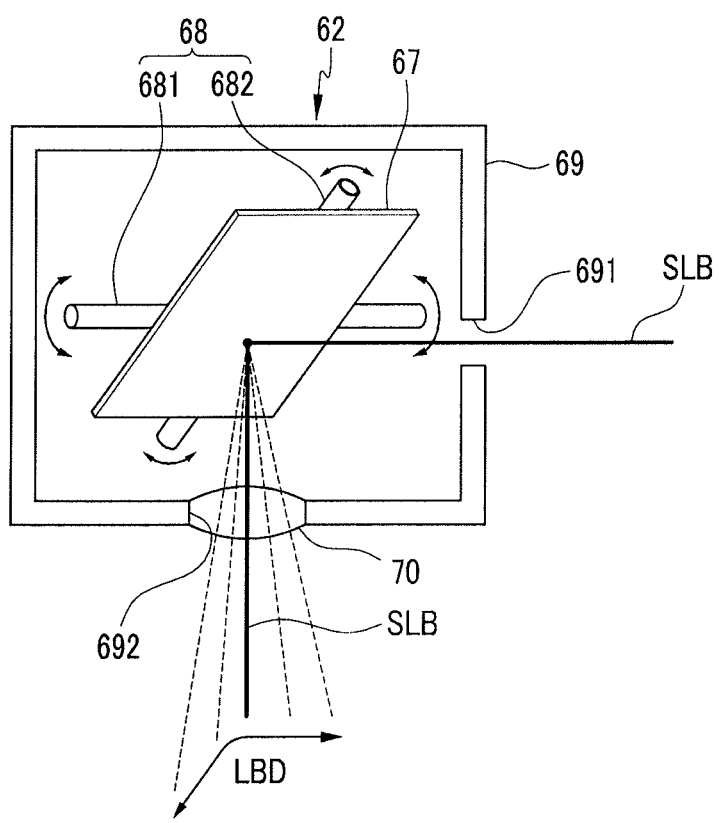
FIG. 15 is a schematic view showing a light swing unit of a substrate cutting device shown in FIG. 14.

FIG. 15 is a schematic view showing the light swing unit of the substrate cutting device shown in FIG. 14.

Referring to FIG. 15, the light swing unit 62 includes a reflector 67 for reflecting a short-pulse laser beam SLB emitted from the short-pulse laser generator 63 and a driver 68 for driving the reflector 67. The driver 68 may include a first rotation shaft 681 and a second rotation shaft 682 crossing the first rotation shaft, and may further include components such as a motor and a controller, which are not shown.

The light swing unit 62 can swing the short-pulse laser beam SLB along a y-directional linear region by finely swinging the reflector 67 by driving the first rotation shaft 681. Moreover, the light swing unit 62 can swing the laser beam along an x-directional linear region by finely swinging the reflector 67 by driving the second rotation shaft 682. Further, the light swing unit 62 can swing the short-pulse laser beam SLB by finely swinging the reflector 67 by a combination of the first rotation shaft 681 and the second rotation shaft 682.

The light swing unit 62 may further include a casing 69 having a light inlet 691 and a light irradiation opening 692, and the light irradiation opening 692 may be provided with one or more lenses 70. The lens 70 allows the swung short-pulse laser beam SLB to have a uniform focal point within the light irradiation region LBD. The lens 70 may be omitted as needed.

Referring again to FIG. 14, the preheating laser generator 64 generates a preheating laser beam LB2, for example, a carbonic acid ($CO_2$) gas laser beam. The preheating laser beam LB2 preheats a part of the mother substrate 121 to which the swung short-pulse laser beam SLB is to be irradiated before the swung short-pulse laser beam SLB removes a part of the mother substrate 121 along the imaginary cut line PCL. A heating area 71 to be heated by the preheating laser beam LB2 is also moved together with the light irradiation region LBD along the imaginary cut line PCL. That is, the swung short-pulse laser beam SLB cuts the mother substrate 121 that has been heated by the preheating laser beam LB2.

The carbonic acid gas laser beam generally has a wavelength of about 10,600 nm, and the carbonic acid gas laser beam with such a wavelength is highly absorbed with water molecules or a hydroxyl group, and shows very high absorption in glass. An auxiliary optical unit 72 adjusts the path of the preheating laser beam LB2 and focuses the preheating laser beam LB2. The auxiliary optical unit 72 may include a mirror (not shown) for adjusting an optical path and at least one light focusing lens (not shown).

With the use of the preheating laser beam LB2, even if cracks are generated when the mother substrate 121 is cut by the swung short-pulse laser beam SLB, the cracks can be prevented from spreading in a direction crossing a cut line CL. That is, the cracks can be induced to be formed along the cut line CL, thus preventing damage around the cut surface of the mother substrate 121. Thus, since the use of the preheating laser beam LB2 further increases the energy level of the swung short-pulse laser beam SLB, even a thicker mother substrate 121 can be easily cut.

The transfer unit 65 moves either or both of the stage 61 and the light swing unit 62 in a direction substantially parallel to the mother substrate 121. Although FIG. 14 has been illustrated with respect to the case where the transfer unit 65 moves the stage 61 in a direction substantially parallel to the mother substrate 121, the present invention is not limited to the illustrated configuration. The transfer unit 65 includes a first transfer unit 651 for moving the stage 61 in an x-axis direction and a second transfer unit 652 for moving the stage 61 in a y-axis direction. The transfer unit 65 is able to freely move the stage in the direction substantially parallel to the mother substrate 121 by a combination of the first transfer unit 651 and the second transfer unit 652.

The cleaning unit 66 removes unnecessary particles generated as the mother substrate 121 is removed by the swung short-pulse laser beam SLB. These particles may cause defects and disturb the path of the short-pulse laser beam SLB. The cleaning unit 66 can remove the particles by ejecting or sucking air. With the cleaning unit 66, the cutting process of the mother substrate 121 can be performed more precisely and quickly.

Figure 16:
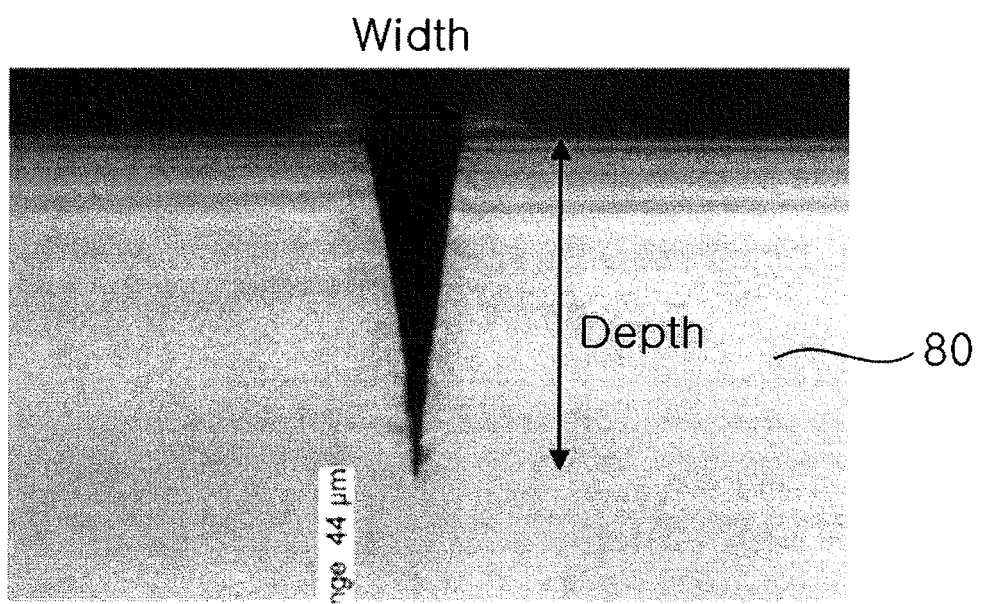
FIG. 16 is a magnified cross-sectional photograph of a glass substrate having a 0.5 mm thickness in which a groove is formed by irradiating a swung short-pulse laser beam.

FIG. 16 is a magnified cross-sectional photograph of a glass substrate having a about 0.5 mm thickness in which a groove is formed by irradiating a swung short-pulse laser beam.

Referring to FIG. 16, the swung short-pulse laser beam forms a groove whose width becomes gradually smaller in a thickness direction from one surface of a glass substrate 80, and a cut surface of the glass substrate 80 is inclined at a predetermined angle, rather than substantially perpendicular, to the one surface of the glass substrate 80. The width of the groove ranges from approximately 10 μm to approximately 100 μm, and the width of the groove can be adjusted by changing an optical device associated with a short-pulse laser beam.

Although FIG. 16 showed that the groove does not completely penetrate the opposite surface of the glass substrate 80, if a glass substrate having a smaller thickness is used or the energy level of the short-pulse laser beam is increased, the glass substrate 80 can be cut by making the groove substantially completely penetrate the opposite surface of the glass substrate 80.

That, as shown in FIG. 14, by irradiating the swung short-pulse laser beam SLB to the mother substrate 121 having a thickness t1, a groove penetrating the mother substrate 121 is formed, and therefore the mother substrate 121 can be cut. In one embodiment, as shown in FIGS. 6 and 7, the cut surfaces 30 and 32 of the first and second substrates 10 and 12 of the completed display device 100 are inclined at a predetermined angle with respect to the surfaces (inner or outer surfaces) of each of the first and second substrates 10 and 12, and are formed in a round shape having a predetermined curvature.

Figure 17:
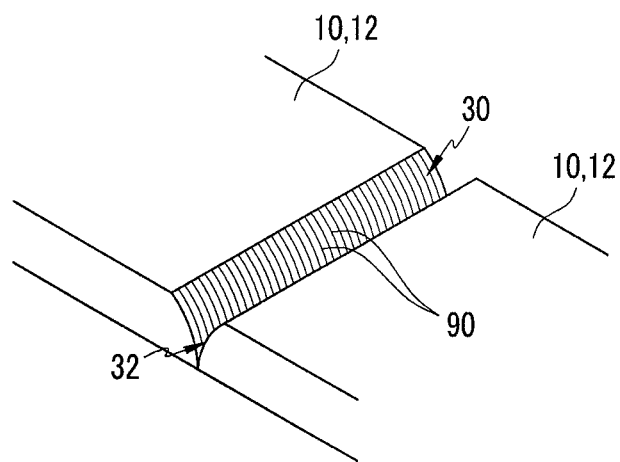
FIG. 17 is a partial enlarged view of a mother substrate shown to explain grains on a cut surface.

However, as the swung short-pulse laser beam SLB is used to cut the mother substrate 121, fine grains resulting from the swinging of the laser beam may be formed on the cut surfaces 30 and 32 of the first and second substrates 10 and 12. That is, as shown in FIG. 17, since the short-pulse laser beam is swung along the lengthwise direction of the light irradiation region, border lines caused by rapid energy changes are formed at every point where the irradiation direction is reversed after the short-pulse laser beam is irradiated in one direction, and these border lines can form a plurality of grains 90 along the width direction of the cut surfaces 30 and 32.

Such a cutting method using the swung short-pulsed laser beam SLB creates a more sleek appearance of the cut surfaces 30 and 32 in comparison with a wheel cutter, generates fewer cracks, and improves the mechanical strength of the display device 100. Moreover, the cutting process can be easily performed even on an ultraslim glass substrate having a thickness of less than about 0.3 mm when the two mother substrates 101 and 121 are integrally bonded by the sealant lines 14. Furthermore, a polishing or edge grinding process subsequent to the cell cutting process can be omitted.

An experimental example and Comparative Examples 1 to 3 will be compared below with reference to FIGS. 18 to 21. In the experimental example, the mother substrate was cut by a swung short-pulse laser beam according to the embodiment, and, in Comparative Examples 1 to 3, the mother substrate was cut by a wheel cutter, an ultrasonic cutter, and an unswung carbonic acid ($CO_2$) gas laser beam, respectively.

Figure 18:
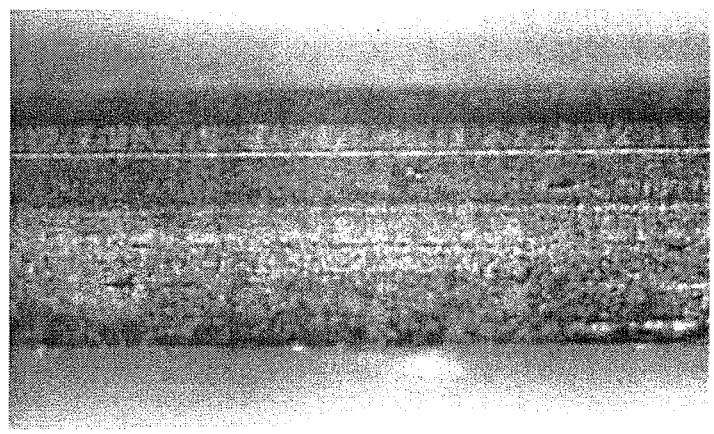
FIG. 18 is a magnified cross-sectional photograph showing a cut surface of a mother substrate cut by a method of an experimental example.
Figure 19:
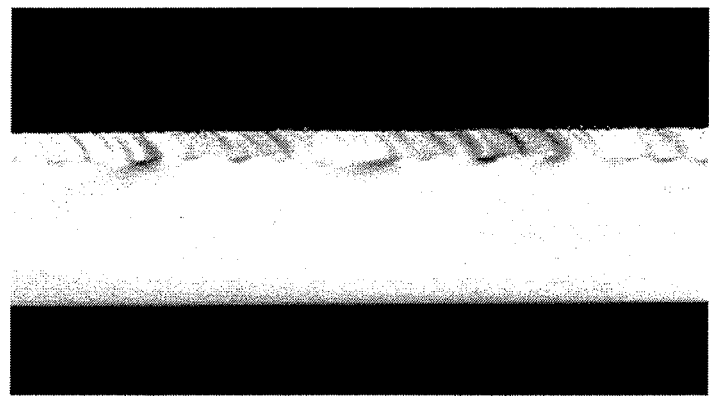
FIG. 19 is a magnified cross-sectional photograph showing a cut surface of a mother substrate cut by a method of Comparative Example 1.
Figure 20:
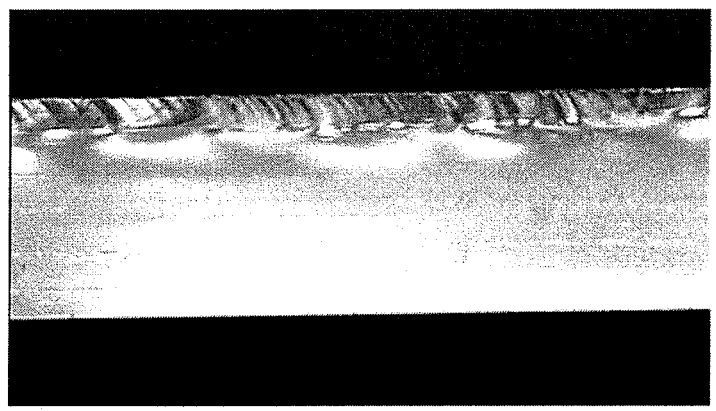
FIG. 20 is a magnified cross-sectional photograph showing a cut surface of a mother substrate cut by a method of Comparative Example 2.
Figure 21:
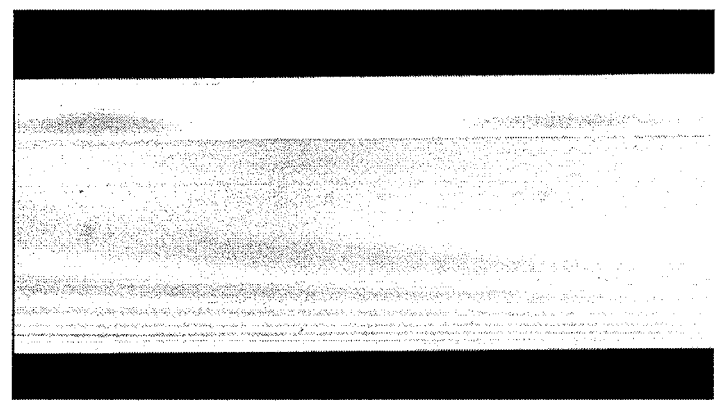
FIG. 21 is a magnified cross-sectional photograph showing a cut surface of a mother substrate cut by a method of Comparative Example 3.

FIG. 18 is a magnified photograph showing a cut surface of the mother substrate cut by a method of the experimental example, and FIGS. 19 to 21 are magnified photographs showing a cut surface of the mother substrate cut by methods of Comparative Examples 1, 2, and 3, respectively.

Referring to FIG. 18, it can be seen that the mother substrate cut by the method of the experimental example has a uniform and stable cut surface formed across the entire thickness. That is, the mother substrate of the exemplary embodiment has a cut surface with uniform grains formed in a cut line direction across the entire thickness.

On the contrary, it can be seen that the mother substrate shown in FIG. 19 and the mother substrate shown in FIG. 19 have a fairly rough cut surface formed on the top that contacts the wheel cutter and the ultrasonic cutter. The mother substrate shown in FIG. 21 has a cut surface with relatively uniform grains. Nonetheless, carbonic acid gas laser cutting has a difficulty in curve cutting and only allows for cutting at a right angle of 90° relative to a cross-section of the other substrate, and, as a result, is not available for making a curved groove.

According to at least one embodiment, as the corners have a curved shape, stress at the corners can be effectively dispersed and mechanical strength can be increased, thereby preventing damage to the display device caused by an external impact. Moreover, the curved corners produce a sleeker appearance, generate fewer cracks, and improve the mechanical strength of the display device. Furthermore, a polishing or edge grinding process subsequent to the cell cutting process can be omitted.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flat panel display comprising:
a first substrate including a display area, wherein at least one display element is formed in the display area;
a second substrate covering the display area and connected to the first substrate; and
a sealant formed between the first and second substrates,
wherein the first substrate and the second substrate comprise a first cut surface and a second cut surface, respectively,
wherein each of the first cut surface and the second cut surface has a plurality of corners each of which is concave from the perspective of the display area,
wherein the first cut surface comprises at least one first concave corner corresponding to at least one second concave corner of the second cut surface, and wherein the first concave corner is not aligned with the second concave corner in a direction substantially perpendicular to one of the first and second substrates.

2. The flat panel display of claim 1, wherein the corners have an arc shape.

3. A flat panel display comprising:
- a first substrate including a display area, wherein at least one display element is formed in the display area;
- a second substrate covering the display area and connected to the first substrate; and
- a sealant formed between the first and second substrates,
- wherein the first substrate and the second substrate comprise a first cut surface and a second cut surface, respectively,
- wherein each of the first cut surface and the second cut surface has a plurality of corners each of which is concave from the perspective of the display area, and
- wherein each of the corners has a curvature radius of about 100 μm to about 2000 μm.

4. The flat panel display of claim 1, wherein each of the first cut surface and the second cut surface further comprises a plurality of linear portions that are positioned between the corners.

5. The flat panel display of claim 4, wherein each of the first cut surface and the second cut surface is inclined, with respect to one surface of each of the first and second substrates at the linear portions and the corners, when viewed from a side of the display device.

6. The flat panel display of claim 5, wherein each of the first cut surface and the second cut surface has a round shape when viewed from the side of the display device.

7. The flat panel display of claim 5, wherein the first cut surface and the second cut surface each have an inward end and an outward end, wherein the inward ends of the first and second cut surfaces are connected to the inner surfaces of the first and second substrates, respectively, and wherein the outward ends of the first and second cut surfaces are connected to the outer surfaces of the first and second substrates, respectively.

8. The flat panel display of claim 5, wherein the first substrate and the second substrate have substantially the same thickness, and wherein the first cut surface and the second cut surface have substantially the same width.

9. The flat panel display of claim 8, wherein the first cut surface and the second cut surface are substantially symmetrical with respect to the sealant along an overlap area of the first substrate and the second substrate.

10. The flat panel display of claim 1, wherein each of the convex corners has a center portion and edge portions, and wherein the center portion is farther from the sealant than the edge portions.

11. The flat panel display of claim 1, wherein the display is an organic light emitting diode display or a liquid crystal display.

12. A flat panel display comprising:
- a first substrate including a display area, wherein at least one display element is formed in the display area;
- a second substrate covering the display area and connected to the first substrate; and
- at least one thin film transistor formed between the first and second substrates,
- wherein each of the first and second substrates has a cut surface, wherein the cut surface has a plurality of corners each of which is convex when viewed from the exterior of the flat panel display,
- wherein the cut surface of the first substrate comprises at least one first convex corner corresponding to at least one second convex corner of the cut surface of the second substrate, and wherein the first convex corner is not aligned with the second convex corner in a direction substantially perpendicular to one of the first and second substrates.

* * * * *